(12) United States Patent
Su

(10) Patent No.: US 6,809,663 B1
(45) Date of Patent: Oct. 26, 2004

(54) DIGITAL SIGNAL MODULATION METHOD

(75) Inventor: Hao-Kuen Su, Taipei Hsien (TW)

(73) Assignee: Via Technologies Inc., Taipei Hsien (TW)

( * ) Notice: Subject to any disclaimer, the term of this patent is extended or adjusted under 35 U.S.C. 154(b) by 0 days.

(21) Appl. No.: 10/708,363

(22) Filed: Feb. 26, 2004

(30) Foreign Application Priority Data

Dec. 4, 2003 (TW) .......................... 92134164 A

(51) Int. Cl.[7] .................................................. H03M 7/00
(52) U.S. Cl. ........................... 341/59; 341/58; 369/59.1
(58) Field of Search ............................. 341/51, 58, 59, 341/65, 67, 68, 95, 102, 106; 369/59.1, 47.19, 59.23, 59.24, 44.34

(56) References Cited

U.S. PATENT DOCUMENTS

| | | | |
|---|---|---|---|
| 5,375,249 A | * | 12/1994 | Cho .......................... 369/59.23 |
| 6,188,336 B1 | * | 2/2001 | Kim ............................ 341/59 |
| 6,268,810 B1 | * | 7/2001 | Shim et al. ................... 341/59 |
| 6,278,386 B1 | * | 8/2001 | Hogan ......................... 341/58 |
| 6,281,815 B1 | * | 8/2001 | Shim et al. ................... 341/59 |
| 6,445,313 B2 | * | 9/2002 | Ahn ............................ 341/59 |
| 6,531,968 B2 | * | 3/2003 | Ahn et al. ..................... 341/59 |
| 6,535,151 B2 | * | 3/2003 | Coene ........................ 341/102 |
| 6,542,452 B1 | * | 4/2003 | Wu et al. ................. 369/59.24 |
| 6,604,219 B1 | * | 8/2003 | Lee et al. .................... 714/769 |
| 6,664,905 B1 | * | 12/2003 | Coene ........................ 341/102 |
| 6,697,311 B1 | * | 2/2004 | Kim .......................... 369/59.1 |

\* cited by examiner

*Primary Examiner*—Michael Tokar
*Assistant Examiner*—Linh Van Nguyen
(74) *Attorney, Agent, or Firm*—Winston Hsu

(57) ABSTRACT

A digital signal modulation method selects a modulation strategy to modulate current M sets of data by determining variations in a digital sum value (DSV) corresponding to the modulated data modulated according to a first modulation strategy from M sets of data ahead of the current M sets of data.

7 Claims, 6 Drawing Sheets

DIGITAL SIGNAL MODULATION METHOD

BACKGROUND OF INVENTION

1. Field of the Invention

The present invention relates to optical disks, and more specifically, to a digital signal modulation method used in an optical disk encoding system.

2. Description of the Prior Art

Due to having outstandingly high capacity and being very compact in size, optical disks such as CDs and DVDs have become popular media choices for data storage. Accordingly, the use of CD and DVD drives to access this data have increased.

The following description explains how a CD drive accesses data on a CD. When burning an 8-bit data byte to the CD, the CD drive controls its pickup head to emit a laser beam onto spiral grooves on the CD according to the data byte. The laser beam volatilizes chemicals in the grooves in order to form a plurality of pits and lands corresponding to the data byte. When reading the data on the CD, the CD drive again controls its pickup head to emit a laser beam onto the CD. Since the resulting light reflected by the pits and the lands in the grooves differ from each other (the pits reflect the beam, while the lands scatter it), the pickup head reads the data from the CD according to these differences in reflection. (The reflection by the pits is more intense than that by the lands).

In order to ensure normal tracking of the pickup head in the CD drive, the data byte is required to be encoded in a specific manner before being burnt onto the CD. Such kind of data encoding includes an eight-to-fourteen modulation (EFM) process and a merging channel bit attaching process (in case of a CD). The EFM process converts the (8-bit) data byte to a 14-bit channel bit code according to a contrast table. The merging channel bit attaching process involves choosing one of four sets of 3-bit merging channel bits (000, 001, 010, 100) according to the variation of a digital sum value (DSV) corresponding to the 14-bit channel bit code and every bit (3T–11T) of another 14-bit channel bit code next to the 14-bit channel bit code. In this way, the chosen set is attached to the 14-bit channel bit code to form a 17-bit channel bit code. Thus the CD drive controls the pickup head to emit the laser beam onto the CD according to the 17-bit channel bit code and forms pits and lands corresponding to the 17-bit channel bit code in the grooves.

The following description explains the calculation of the DSV corresponding to a channel bit code. If the channel bit code is 10010000000010010, the corresponding DSV is 1232 10(−1)(−2)(−3)(−4)(−5)(−6) (−5)(−4)(−3)(−4)(−5), where each "1" appearing in the channel bit code corresponds to the points of change (from increasing to decreasing, or from decreasing to increasing) of the DSV.

For instance, assuming there are three data bytes V, I, A to be burned on the CD. The ASCII codes of the letters V, I, A are 01010110b(86d), 01001001b(73d), 01000001b (65d), respectively. The 14-bit channel bit codes corresponding to these three binary codes are 00010010000100, 10000001000100, 10000100100100, respectively. The 3-bit merging channel bit codes selected according to the DSV of these three 14-bit channel bit codes are 000, 100, 000, respectively. The CD drive controls the pickup head to emit the laser beam according to a burning code being 00010010000100000100000010001001001000010010 0100 100000 (the merging channel bit codes are underlined) in order to form the pits and lands in the grooves of the CD. The DSV corresponding to the burning code is 123210123454321(−1)0123456543456787656789(10).

The CD drive controls the pickup head to change the laser emission whenever "1" appears in the burning code. It controls the pickup head to stop the laser emission or restart the laser emission in order to form the pits and lands. It can be said that every boundary of a pit and a land corresponds to the appearance of "1". In other words, whenever a "1" appears in the burning code, the difference between the accumulated number of pits and that of the lands changes, and the DSV corresponding to each bit of the burning code represents the difference between the accumulated number of pits and that of the lands.

When selecting the 3-bit merging channel bit code to insert between two 14-bit channel bit codes, the number of "0"'s between two neighboring "1"'s in the 31(14+3+14)-bit channel bit code is required to be between 2 and 10 (3T–11T). The DSV corresponding to the 31-bit channel bit code (i.e. the difference between the number of pits and the number of lands) is also required to be approach 0 in order to ensure the DSV is within a threshold range (i.e. the maximum of the DSV being lower than the upper limit of the threshold range, and the minimum of the DSV being higher than the lower limit of the threshold range). In this way, the power spectrum of a high frequency (HF) signal is with a predetermined range.

The conventional method for selecting the merging channel bit code is to choose one from the four sets of 3-bit merging channel bits (000, 001, 010, 100) according to the variation of the DSV. The one selected is inserted between two neighboring 14-bit channel bit codes (of course limited by a condition of 3T–11T). Briefly, if the DSV corresponding to the previous 14-bit channel bit code approaches 0, choose "000" to be the merging channel bit code, otherwise choose one from "001", "010", "100" complying with 3T–11T to be the merging channel bit code.

Please refer to FIG. 1 showing the relationship between a conventional burning code and its corresponding DSV. The conventional method for selecting the merging channel bit code only ensures the DSV "locally" approaches 0 (indicated by arrows A, B, and C shown in FIG. 1). However, it is unable to ensure the DSV remains within the threshold range for the long term (indicated by arrow D shown in FIG. 1). If the DSV exceeds the threshold range, the data burned by the CD drive can not be re-read.

SUMMARY OF INVENTION

It is therefore a primary objective of the present invention to provide a digital signal modulation method for use in a CD/DVD encoding system to ensure the data burned to a CD/DVD can be read correctly by a CD/DVD drive.

Briefly summarized, a digital signal modulation method attaches bits of a predetermined number next to each one of a plurality of first bit streams in order to generate a plurality of second bit streams. The method includes (a) adjusting the bits of the predetermined number attached to a following plurality of first bit streams after generating the plurality of the second bit streams according to the variation of a DSV corresponding to the plurality of bits in the plurality of second bit streams, and (b) attaching the bits of the predetermined number to the first bit stream according to Step (a) and the DSV of each bit in the following plurality of first bit streams after generating the plurality of the second bit streams, in order to make the DSV of the bits of a following plurality of second bit streams after generating the plurality of the second bit streams approach 0.

These and other objectives of the present invention will no doubt become obvious to those of ordinary skill in the art after reading the following detailed description of the preferred embodiment that is illustrated in the various figures and drawings.

DETAILED DESCRIPTION

The present invention can be applied in a CD drive or a DVD drive. The following description uses a CD as an example.

Figure 1:
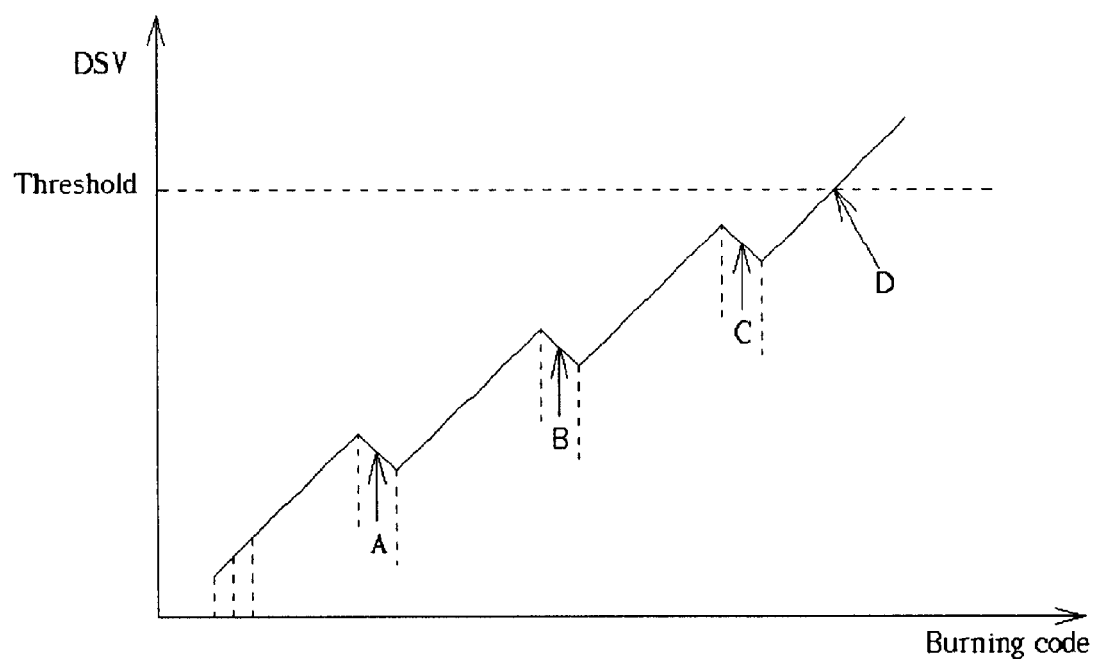
FIG. 1 illustrates the relationship between a conventional burning code and its corresponding DSV.
Figure 2:
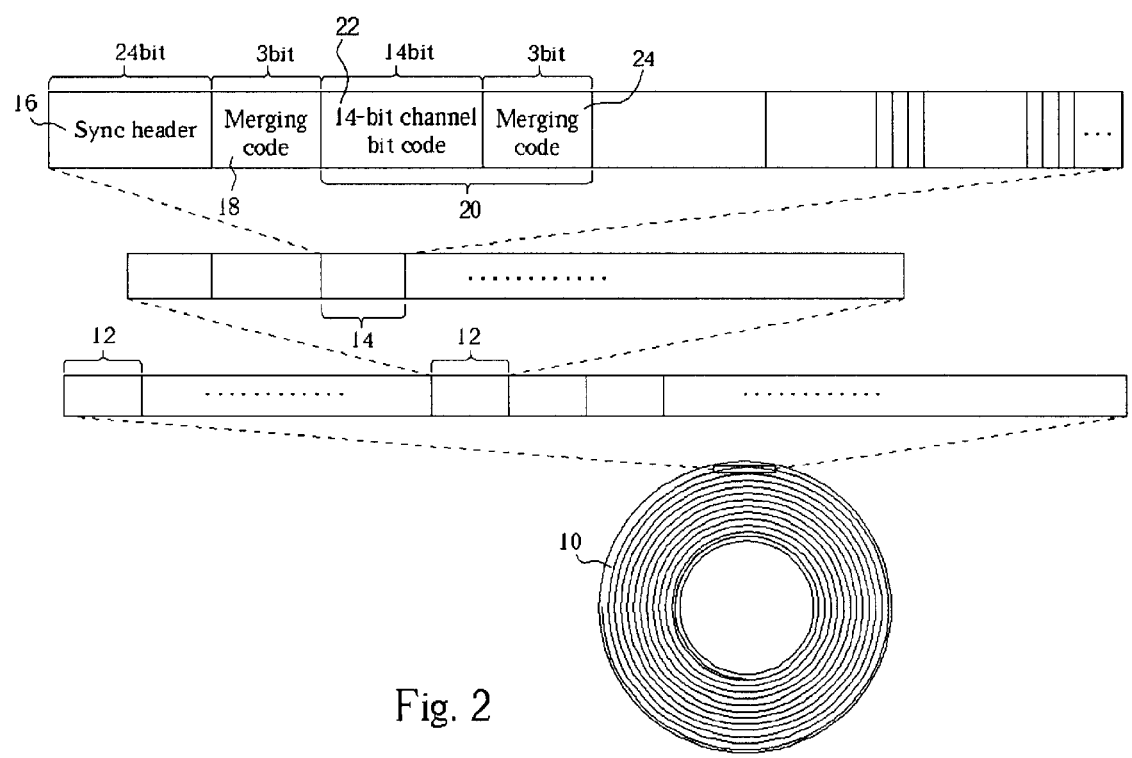
FIG. 2 illustrates a CD according to the present invention.

Please refer to FIG. 2 showing a CD 10 according to the present invention. Data is stored on the CD 10 in blocks 12. Each block includes 98 frames 14, and each frame 14 includes in sequence a 24-bit sync header 16, a 3-bit merging channel bit code 18 corresponding to the sync header, and 33 sets of 17-bit channel bit codes 20. Each 17-bit channel bit code 20 includes a 14-bit channel bit code 22 (converted from a data byte using EFM) and a 3-bit merging channel bit code 24. Therefore, each frame has 588 channel bits.

Figure 3:
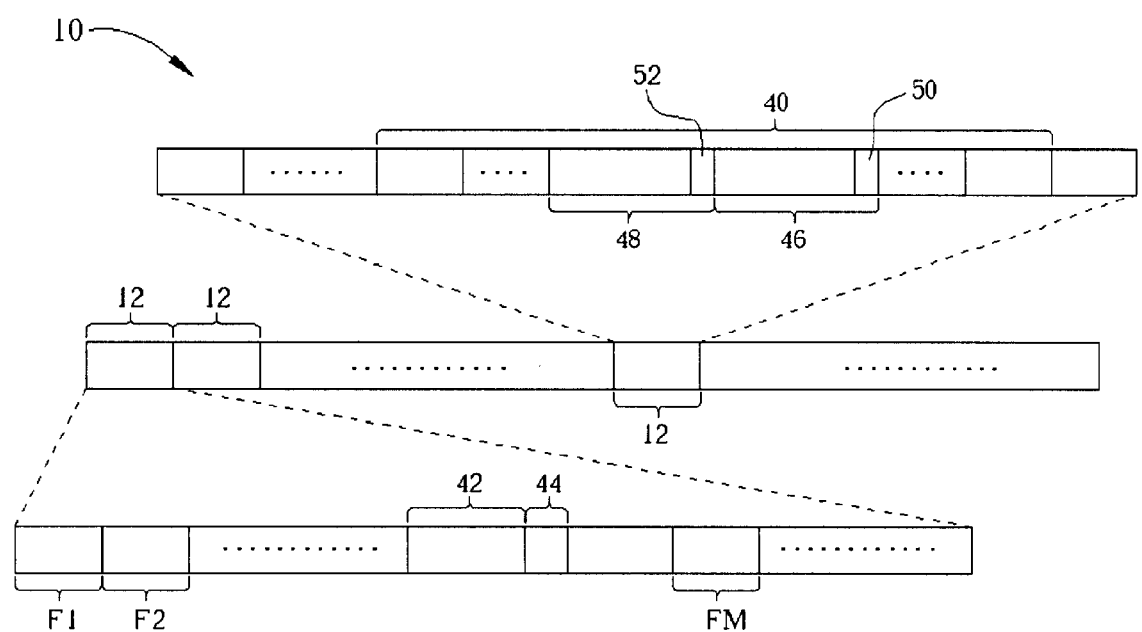
FIG. 3 further illustrates the CD of FIG. 2.

Please refer to FIG. 3 further showing the CD 10 according to the present invention. As shown in FIG. 3, the 3-bit merging channel bit code attached to each 14-bit channel bit code within the initial M frames $F_1$ to $F_M$ of the CD 10 is generated according to a first modulation strategy. As described in the prior art, within $F_1$ to $F_M$, if a DSV corresponding to a 14-bit channel bit code 42 approaches 0, choose "000" to be a merging channel bit code 44 attached next to the 14-bit channel bit code 42, otherwise choose one from "001", "010", "100" complying with 3T–11T to be the merging channel bit code 44 attached next to the 14-bit channel bit code 42. In every section of M frames next to $F_1$ to $F_M$, the attachment of the 3-bit merging channel bit code is performed according to either the first modulation strategy or a second modulation strategy different from the first modulation strategy. More clearly, please refer to FIG. 3, if a first section of M frames 40 has over N continuous frames, the number of time that the DSV corresponding to a last channel bit 50 of a 17-bit channel bit code 46 being larger than the DSV corresponding to a last channel bit 52 of a 17-bit channel bit code 48 exceeds K. In this case, generate the merging channel bit code of the section of M frames next to the first section of M frames 40 according to the second modulation strategy, otherwise generate it according to the first modulation strategy. Under the same scenario, if a first section of M frames 40, which is formed according to the second modulation strategy instead of the first modulation strategy, has over N contiguous frames, the number of time that the DSV corresponding to a last channel bit 50 of a 17-bit channel bit code 46 being larger than the DSV corresponding to a last channel bit 52 of a 17-bit channel bit code 48 exceeds a predetermined value K. In this case, generate the merging channel bit code of the section of M frames next to the first section of M frames 40 according to the first modulation strategy, otherwise generate it according to the second modulation strategy.

Figure 4:
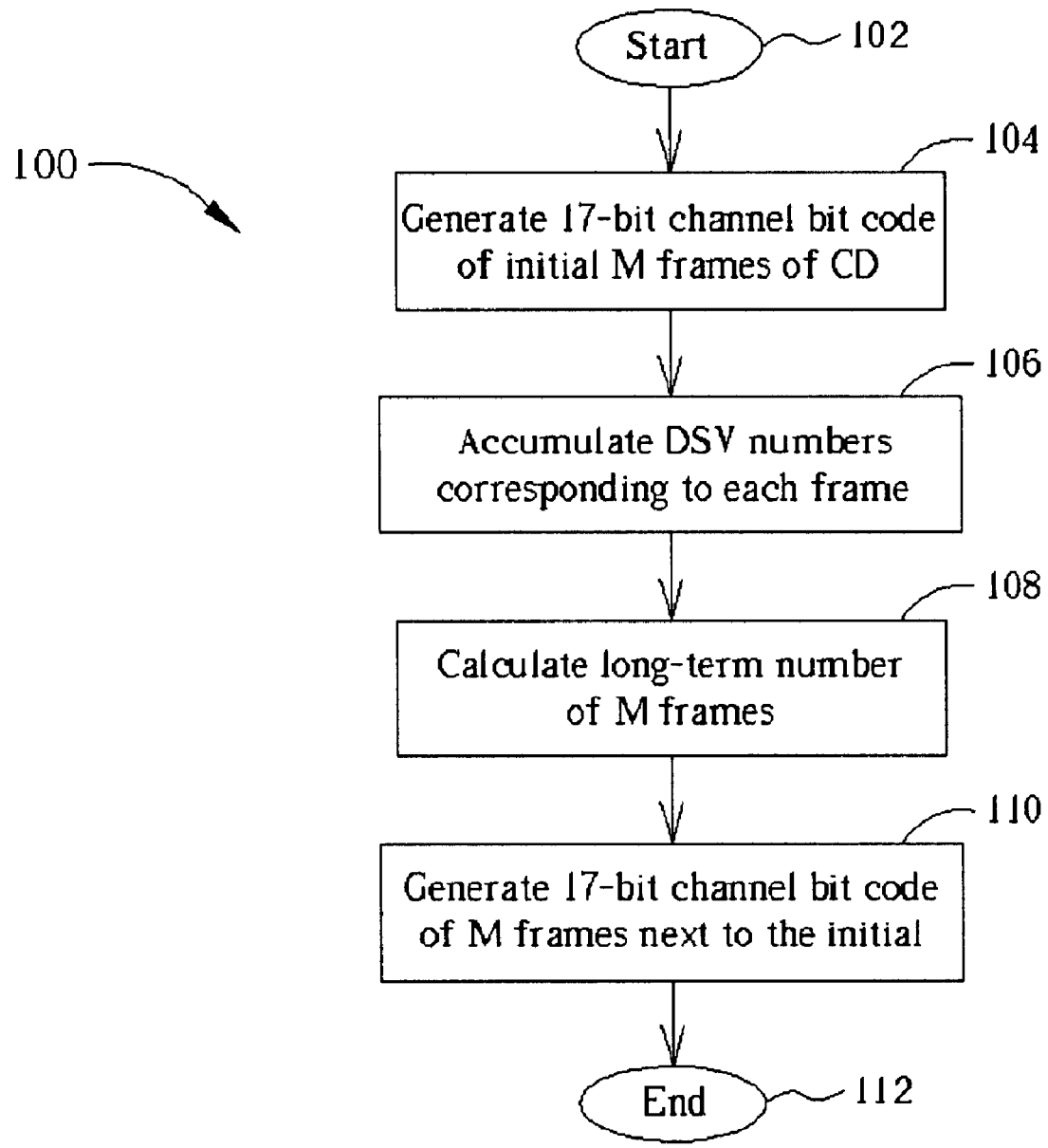
FIG. 4 is a flowchart for a data modulating method used in a CD encoding system according to the present invention.

Please refer to FIG. 4 showing a flowchart for a data modulating method 100 used in a CD encoding system according to the present invention. The CD encoding system includes a CD modulating code generator (not shown) for generating the 3-bit merging channel bit code attached to the 14-bit channel bit code, in order to generate the 17-bit channel bit code corresponding to the 14-bit channel bit code. The method 100 includes following steps:

Step 102: Start (data including a plurality of data bytes to be burned on the CD 10 are modulated into a plurality of corresponding 14-bit channel bit codes).

Step 104: Generate in sequence the merging channel bit codes attached next to each 14-bit channel bit code within $F_1$ to $F_M$ according to the first modulation strategy by the CD modulating code generator. In other words, generate the 17-bit channel bit codes corresponding to the plurality of 14-bit channel bit codes.

Step 106: Accumulate the number of times that the DSV corresponding to a last channel bit of a 17-bit channel bit code are larger than the DSV corresponding to a last channel bit of a previous 17-bit channel bit code within each frame from $F_1$ to $F_M$, until a DSV number corresponding to the frame.

Step 108: Accumulate the number of times that the DSV numbers corresponding to every frame within $F_1$ to $F_M$ are larger than a local threshold, until a long-term number corresponding to frames $F_1$ to $F_M$.

Step 110: If the long-term number is less than a long-term threshold, according to the first modulation strategy by the CD modulating code generator, generate in sequence the merging channel bit codes attached next to each 14-bit channel bit code within the section of M frames next to $F_1$ to $F_M$. Otherwise if the long-term number is larger than the long-term threshold, generate the merging channel bit codes according to the second modulation strategy (the second modulation strategy is completely opposite to the first modulation strategy, i.e. if the DSV corresponding to the 14-bit channel bit code approaches 0, according to the first modulation, choose "000" to be the merging channel bit code attached next to the 14-bit channel bit code, but according to the second modulation strategy, select one from "001", "010", "100" to be the merging channel bit code attached next to the 14-bit channel bit code while maintaining the condition of 3T–11T. Conversely, if the DSV corresponding to the 14-bit channel bit code deviates from 0, according to the first modulation, select one from "001", "010", "100" to be the merging channel bit code attached next to the 14-bit channel bit code while maintaining the condition of 3T–11T, but according to the second modulation strategy, choose "000" to be the merging channel bit code attached next to the 14-bit channel bit code. Although the merging channel bit code selected according to the second modulation strategy makes the DSV corresponding to the merging channel bit code locally deviate from 0, the DSV corresponding to the 14-bit channel bit code next to the merging channel bit code is better at approaching 0 than the DSV corresponding to the merging channel bit code.

This is the reason why the present invention locally deviates from 0, but over the long-term, approaches 0.).

Step 112: Determine whether there is data still requiring to be burnt onto the CD 10. If yes, proceed to Step 106, and if no, proceed to Step 114.

Step 114: End (at this time, the data is completely burned onto the CD 10).

The method of Step 108 can also be changed to accumulate the number of times that the DSV numbers corresponding to every frame within $F_1$ to $F_M$ are less than a local threshold, until a long-term number corresponding to frames $F_1$ to $F_M$; instead of accumulating the number of time that the DSV numbers corresponding to every frame within $F_1$ to $F_M$ are larger than a local threshold, until a long-term number corresponding to frames $F_1$ to $F_M$. The term "larger than" means the DSV grows larger and eventually exceeds the upper limit of the threshold range, and the term "less than" means the DSV grows smaller and eventually exceeds the lower limit of the threshold range.

For instance, assume M, the local threshold, and the longterm threshold are 100, 28 and 70, respectively. Within $F_1$ to $F_{100}$ (M=100), if there are over 70 frames in which the DSV numbers of 33 17-bit channel bit codes exceed or are equal to 28 (the number of times that the DSV corresponding to the last channel bit code of the 17-bit channel bit code are larger than the DSV corresponding to the last channel bit of the previous 17-bit channel bit code in the 33 17-bit channel bit codes exceeds the local threshold, or the number of times that the DSV corresponding to the last channel bit code of the 17-bit channel bit code are less than the DSV corresponding to the last channel bit of the previous 17-bit channel bit code in the 33 17-bit channel bit codes exceeds the local threshold). This means that generating the merging channel bit codes corresponding to each 14-bit channel bit code cannot effectively make the DSV approach 0. Therefore, in order to make the DSV approach 0 so that the data stored on the CD 10 can be correctly read by the CD drive, it is required to generate the merging channel bit codes corresponding to each 14-bit channel bit code within the 100 frames next to $F_1$ to $F_{100}$ according to the second modulation strategy.

It should also be noted, M in the method 100 cannot be too small, in order to comply with the low frequency suppression of the DSV.

Figure 5:
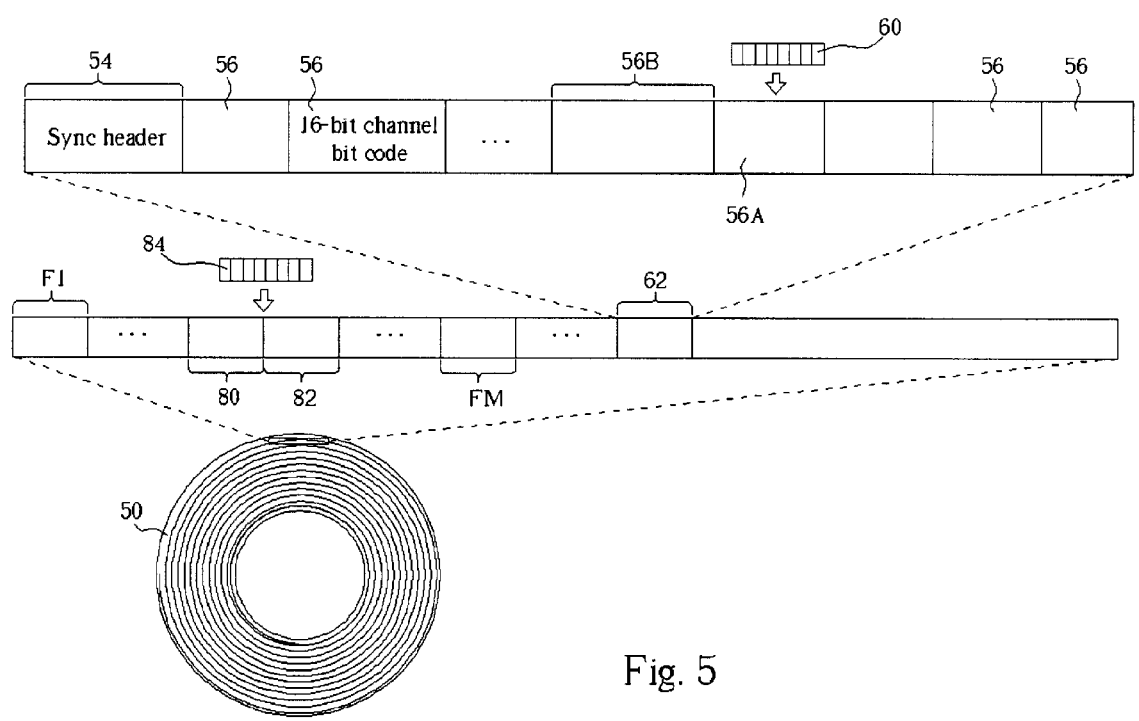
FIG. 5 illustrates a DVD according to the present invention.

The following description uses a DVD as an example. Please refer to FIG. 5 showing a DVD 60 according to the present invention. Data is stored on the DVD 60 in frames. Each frame 62 includes a sync header 54 and 91 16-bit modulating codes 56. Each 16-bit modulating code corresponds to a data byte. Differing from CD modulation, DVD modulation generates a 16-bit modulating code according to a specific modulation strategy referring a main conversion table and a substitution conversion table. Of course the continuously arranged 16-bit modulating codes 56 are also limited by the condition of 3T–11T. Similar to CD modulation, DVD modulation chooses one 16-bit modulating code corresponding to a data byte 60 from the main conversion table or the substitution conversion table, according to the variation of the DSV corresponding to a 16-bit modulating code 56B previous to a 16-bit modulating code 56A corresponding to the data byte 60.

Figure 6:
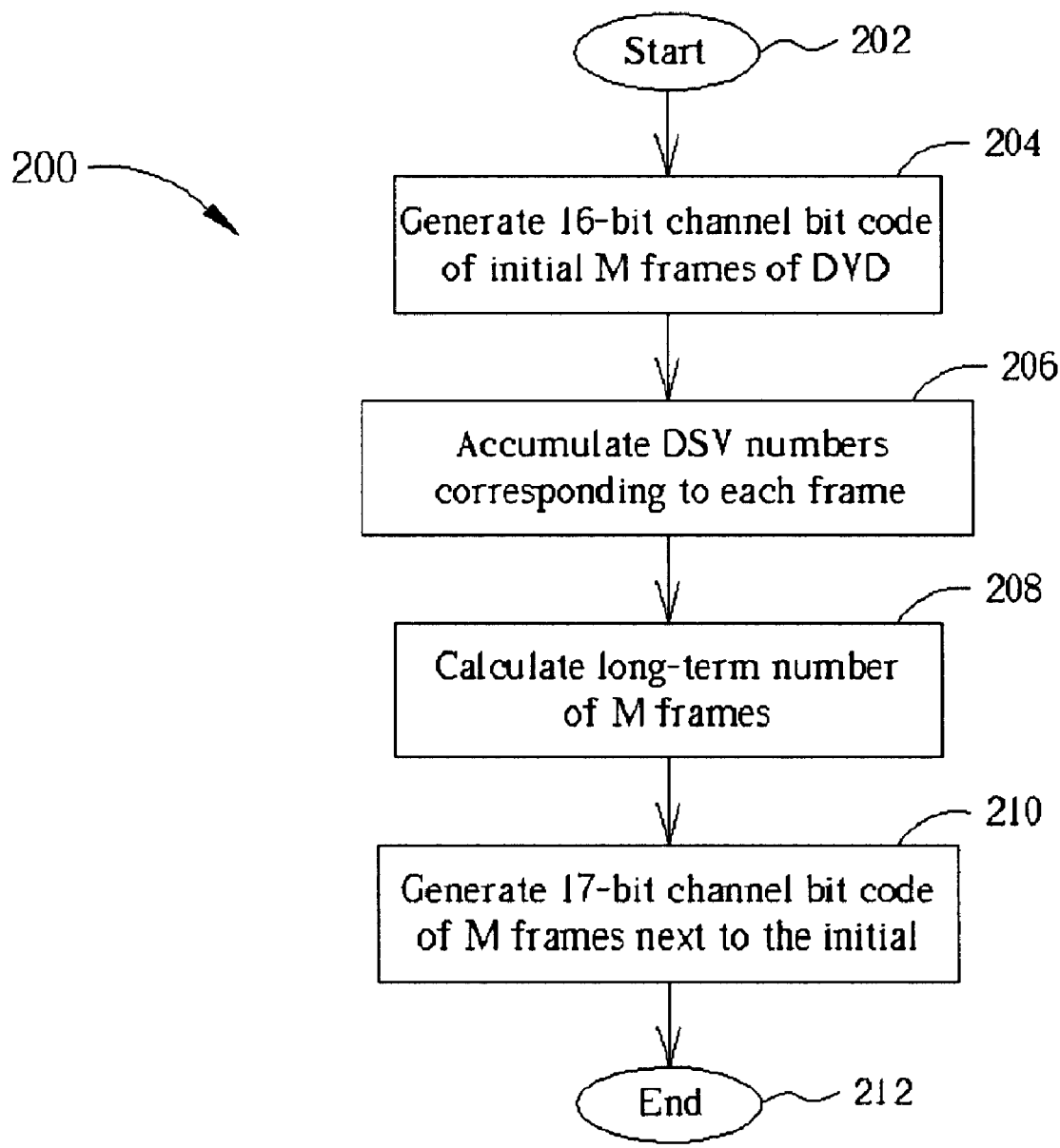
FIG. 6 is a flowchart for a data modulating method used in a DVD encoding system according to the present invention.

Please refer to FIG. 6 showing a flowchart for a data modulating method 100 used in a DVD encoding system according to the present invention. The DVD encoding system includes a DVD modulating code generator (not shown) for selecting a 16-bit modulating code corresponding to the data byte from the main conversion table or the substitution conversion table, according to a specific modulation strategy. The method 200 includes following steps:

Step 202: Start (data to be burnt onto the DVD 60 includes a plurality of data bytes).

Step 204: Select in sequence the 16-bit modulating codes corresponding to each data byte of the DVD 60 from the main conversion table or the substitution conversion table, according to a first modulation strategy by the DVD modulating code generator (the first modulation strategy being to select a 16-bit modulating code 82 corresponding to a data byte 84 from the main conversion table or the substitution conversion table, according to the DSV variation corresponding a 16-bit modulating code 80 previous to the 16-bit modulating code 82 within initial M frames $F_1$ to $F_M$ of the DVD).

Step 206: Accumulate the number of times that the DSV corresponding to a last channel bit of a 16-bit modulating code is larger than the DSV corresponding to a last channel bit of a previous 16-bit modulating code within each frame from $F_1$ to $F_M$, until a DSV number corresponding to the frame.

Step 208: Accumulate the number of times that the DSV numbers corresponding to every frame within $F_1$ to $F_M$ are larger than a local threshold, until a long-term number corresponding to frames $F_1$ to $F_M$.

Step 210: If the long-term number is less than a longterm threshold, generate in sequence the 16-bit modulating codes within the section of M frames next to $F_1$ to $F_M$, according to the first modulation strategy and referring to the contrast table, using the DVD modulating code generator. Otherwise, if the long-term number is larger than the long-term threshold, generate the 16-bit modulating codes according to a second modulation strategy (the second modulation strategy being completely opposite to the first modulation strategy. Wherein, according to the first modulation, if the DSV corresponding to the 16-bit modulating code approaches 0, choose a 16-bit modulating code corresponding to a data byte and being next to the 16-bit modulating code (if it is still possible to choose a second 16-bit modulating code) from the main conversion table or the substitution conversion table. According to the second modulation strategy, modulate the data byte into the second 16-bit modulating code. If a data byte corresponds to only one 16-bit modulating code in the main conversion table or the substitution conversion table, according to both the first and the second modulation strategy, modulate the data byte into the 16-bit modulating code. Although the 16-bit modulating code selected according to the second modulation strategy makes the DSV corresponding to the previous few channel bits of the 16-bit modulating code locally deviate from 0, the DSV corresponding to the last channel bits of the 16-bit modulating code is better at approaching 0 than the DSV corresponding to the previous few channel bits of the 16-bit modulating code. This is the reason why the present invention locally deviates from 0, but over the long-term, approaches 0.).

Step 212: Determine whether there is data still required to be burned onto the DVD 60. If yes, proceed to Step 206, and if no, proceed to Step 214.

Step 214: End (at this time, the data is completely burned onto the DVD 60).

The method of Step 208 can also be changed to accumulate the number of times that the DSV numbers corresponding to every frame within $F_1$ to $F_M$ are less than a local threshold, until a long-term number corresponding to frames $F_1$ to $F_M$; instead of accumulating the number of times that the DSV numbers corresponding to every frame within $F_1$ to $F_M$ are larger than a local threshold, until a long-term number corresponding to frames $F_1$ to $F_M$. The term "larger than" means the DSV grows larger and eventually exceeds the upper limit of the threshold range, and the term "less than" means the DSV grows smaller and eventually exceeds the lower limit of the threshold range.

Similarly, M in the method 200 cannot be too small, in order to comply with the low frequency suppression of the DSV.

In contrast to the prior art, the present invention applies different modulation strategies corresponding to the merging channel bit code/16-bit modulating code with M frames, according to the variation of the DSV corresponding to the channel bits previous to the M frames. Therefore the present invention ensures the DSV of the 17-bit/10-and-more-bit modulating code is within the threshold range.

Those skilled in the art will readily observe that numerous modifications and alterations of the device and method may be made while retaining the teachings of the invention, Accordingly, the above disclosure should be construed as limited only by the metes and bounds of the appended claims.

What is claimed is:

1. A digital signal modulation method for attaching bits of a predetermined number next to each one of a plurality of first bit streams in order to generate a plurality of second bit streams, the method comprising:
   (a) adjusting the bits of the predetermined number attached to a following plurality of first bit streams after generating the plurality of the second bit streams, according to the variation of a digital sum value (DSV) corresponding to the plurality of bits in the plurality of second bit streams; and
   (b) attaching the bits in the predetermined number to the first bit stream, according to Step (a) and the DSV of each bit in the following plurality of first bit streams after generating the plurality of the second bit streams, in order to make the DSV of the bits of a following plurality of second bit streams after generating the plurality of the second bit streams approach 0.

2. The method of claim 1, further comprising before performing Step (a) and Step (b), according to the DSV of the bits in the plurality of first streams, attaching the bits of the predetermined number to the first bit stream in order to generate the second bit stream corresponding to the first bit stream.

3. The method of claim 1, further comprising storing the DSV corresponding to the plurality of bits into a memory.

4. The method of claim 1, applied in an optical disk being a CD, each of the first bit streams being 14 bits, and Step(a) being attaching 3 bits next to the first bit stream in order to generate the second bit stream of 17 bits.

5. The method of claim 1, further comprising modulating 8-bit digital signals into the 14-bit first bit streams.

6. The method of claim 1, applied in an optical disk being a DVD, each of the first bit streams being 8-bit, and Step (a) being attaching 8 bits next to the first bit stream in order to generate the second bit stream of 16 bits.

7. The method of claim 1, wherein Step (a) comprises selecting a modulating code that makes the DSV corresponding to each bit in a frame approach 0, from a main conversion table and a substitution table and according to whether the DSV corresponding to each bit in the frame deviates from or approaches 0, to be the bits in the predetermined number, and Step (b) comprises selecting a modulating code that makes the DSV corresponding to each bit in the frame deviate from 0, from the main conversion table and the substitution table and according to whether the DSV corresponding to each bit in the frame deviates from or approaches 0, to be the bits in the predetermined number.

* * * * *